(12) United States Patent
Liu

(10) Patent No.: US 6,646,880 B1
(45) Date of Patent: Nov. 11, 2003

(54) HEAT SINK CLIP

(75) Inventor: HeBen Liu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/299,887

(22) Filed: Nov. 18, 2002

(30) Foreign Application Priority Data

Jul. 10, 2002 (TW) .................................. 91210507 U

(51) Int. Cl.[7] .................................................. H05K 7/20
(52) U.S. Cl. ......................... 361/719; 24/458; 165/185; 257/719
(58) Field of Search .............................. 257/718, 719, 257/722, 726, 727; 361/687, 703, 704, 705, 709–712, 717–719, 720; 248/505, 510; 24/453, 457, 458; 165/80.3, 185; 174/16.3; 439/485, 487

(56) References Cited

U.S. PATENT DOCUMENTS 5,208,731 A * 5/1993 Blomquist .................. 361/704
5,276,585 A * 1/1994 Smithers .................... 361/704
5,991,154 A * 11/1999 Clemens et al.
6,362,963 B1 * 3/2002 Lee et al. .................... 361/704
6,370,024 B1 * 4/2002 Lo ............................. 361/704
6,396,696 B1 * 5/2002 Lin et al. .................... 361/704
6,449,157 B1 * 9/2002 Chu

* cited by examiner

Primary Examiner—Gerald Tolin
(74) Attorney, Agent, or Firm—Wei Te Chung

(57) ABSTRACT

A heat sink clip (10) includes two side plates (104), and two pressing portions (102) connecting between opposing ends of the side plates. Each pressing portion is generally arcuate, which enables it to resiliently press a heat sink. Each side plate is sloped slightly inwardly from top to bottom. This enables the side plates to resiliently clamp a mounting frame. Two first handles (114) are upwardly formed from top edges of the side plates respectively. Two second handles (124) extend outwardly in respective opposite directions from opposite side edges of each side plate. Two legs (134) depend from opposite ends respectively of a bottom edge of each side plate. Two spaced hooks (136) are inwardly formed from a free end of each leg. Two openings (144) are defined in the opposite ends of each side plate respectively, for insertion of a screwdriver thereinto.

15 Claims, 3 Drawing Sheets

HEAT SINK CLIP

BACKGROUND OF THE INVENTION

1. Field of the Invention

The present invention relates to heat sink clips, and more particularly to a heat sink clip which easily and securely mounts a heat sink in a mounting frame.

2. Description of Related Art

A computer central processing unit (CPU) is the core administrator of electrical signals in most contemporary personal computers. Continued development of CPUs has enabled them to perform more and more functions. Heat generated by CPUs has increased commensurately. Such heat can adversely affect the operational stability of computers. Measures must be taken to efficiently remove the heat from the CPU. Typically, a heat sink having great heat conductivity is mounted on the CPU to remove heat therefrom. A clip is frequently used to firmly attach the heat sink to the CPU, thus achieving greater efficiency of heat dissipation.

A conventional clip for fastening a heat sink to a CPU is formed from a single plate, and has a generally M-shaped profile. The clip defines opposite slots matching with ears of a socket, and thereby attaches the heat sink to an upper surface of the CPU. However, modem heat sinks are frequently very large. A single clip received in a middle of the heat sink may not be strong enough to securely fasten the heat sink on the surface of the CPU. The heat sink is liable to be displaced relative to the upper surface of the CPU when the assembly is subjected to vibration or shock during use. To overcome these problems, a pair of clips respectively mounted on opposite sides of the heat sink has been devised. Good examples are shown in U.S. Pat. Nos. 6,370,024 B1 and 6,362,963 B1. These clips are independent components, which makes mounting of them on a heat sink unduly inconvenient. In addition, transportation of the separate components is bulkier and more expensive.

Still another kind of clip has been devised to overcome the above-described disadvantages. As shown in China Patent No. 01215320.6, the clip is made from two independent parts to form a whole. Unfortunately, this clip is inconvenient to use when mounting a heat sink to a CPU. This is because the clip has no handles, openings or other devices to facilitate manual operation or operation with a tool. Similarly, the clip is inconvenient to use when dismounting the heat sink from the CPU.

SUMMARY OF THE INVENTION

Accordingly, an object of the present invention is to provide a heat sink clip which easily mounts and dismounts a heat sink to and from an electronic package such as a CPU.

Another object of the present invention is to provide a heat sink clip which securely mounts a heat sink in a mounting frame.

In order to achieve the objects set out above, a heat sink clip includes two side plates and two pressing portions. The pressing portions connect between opposing ends of the side plates. Each pressing portion is generally arcuate, which enables it to resiliently press a heat sink. Each side plate is sloped slightly inwardly from top to bottom. This enables the side plates to resiliently clamp a mounting frame. A pair of first handles is upwardly formed from top edges of the side plates respectively. A pair of second handles extends outwardly in respective opposite directions from opposite side edges of each side plate. A pair of legs depends from opposite ends respectively of a bottom edge of each side plate. A pair of spaced hooks is inwardly formed from a free end of each leg. A pair of openings is defined in the opposite ends of each side plate, for insertion of a screwdriver thereinto.

Other objects, advantages and novel features of the present invention will become more apparent from the following detailed description when taken in conjunction with the accompanying drawings, in which:

DETAILED DESCRIPTION OF THE INVENTION

Figure 1:
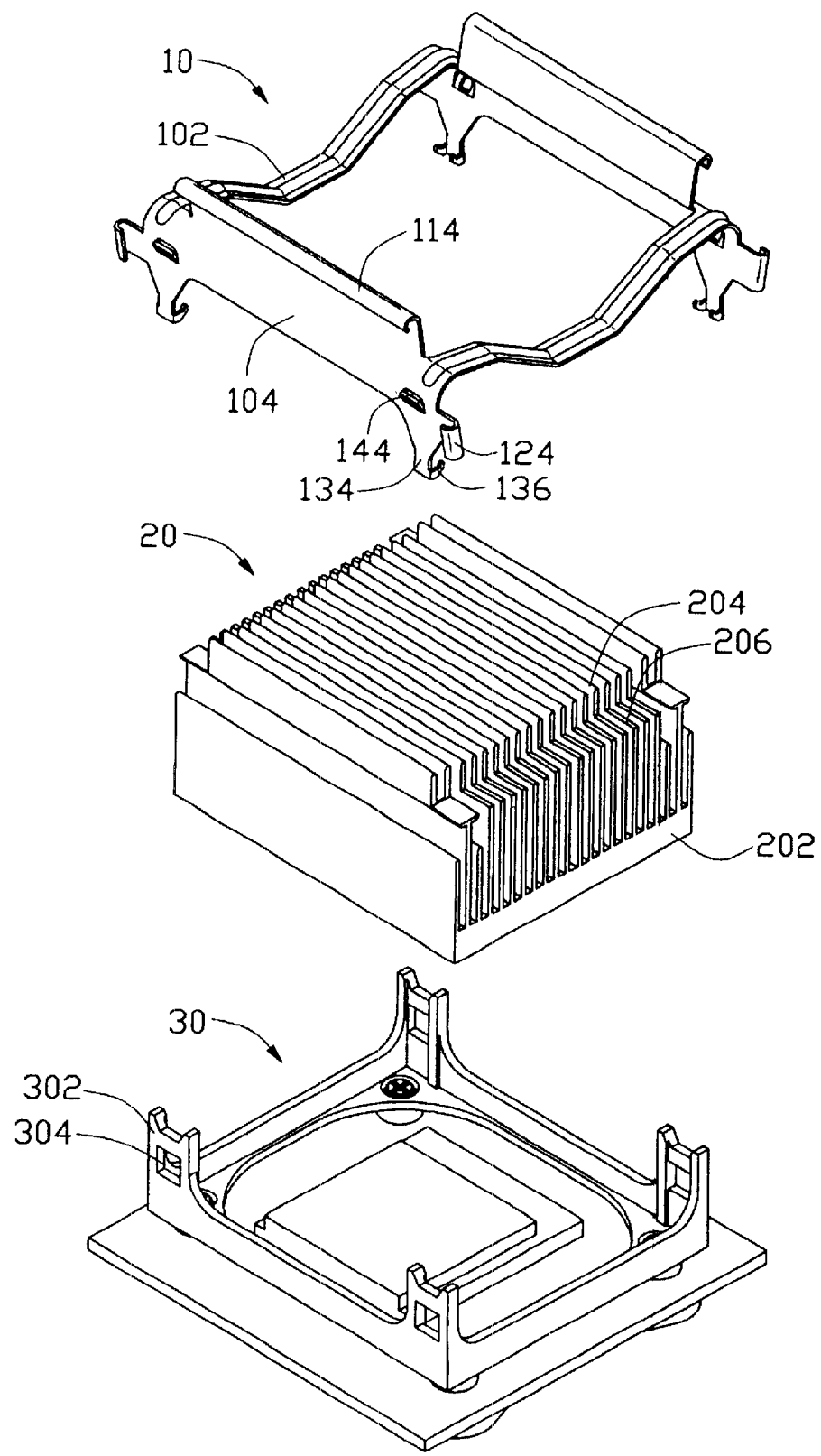
FIG. 1 is an exploded isometric view of a heat sink clip in accordance with the present invention, together with a heat sink, and a mounting frame fixed on a printed circuit board (PCB) around an electronic package.

Reference will now be made to the drawing figures to describe the preferred embodiment of the present invention in detail.

Referring to FIG. 1, a heat sink clip 10 in accordance with a preferred embodiment of the present invention is for mounting a heat sink 20 on a mounting frame 30. The heat sink 20 includes a chassis 202, and plurality of parallel heat sink fins 204 extending upwardly from the chassis 202. Top portions of opposite ends of each fin 204 are cut away to respectively form a pair of indented portions. The indented portions of the heat sink fins 204 thus cooperatively form a pair of recessed portions 206 at respective opposite sides of the heat sink 20. The mounting frame 30 is fixed on a printed circuit board (PCB, not labeled) around an electronic package (not labeled). Two spaced protrusions 302 extend upwardly from each of opposite sides of the mounting frame 30. A hole 304 is defined in each protrusion 302.

Figure 2:
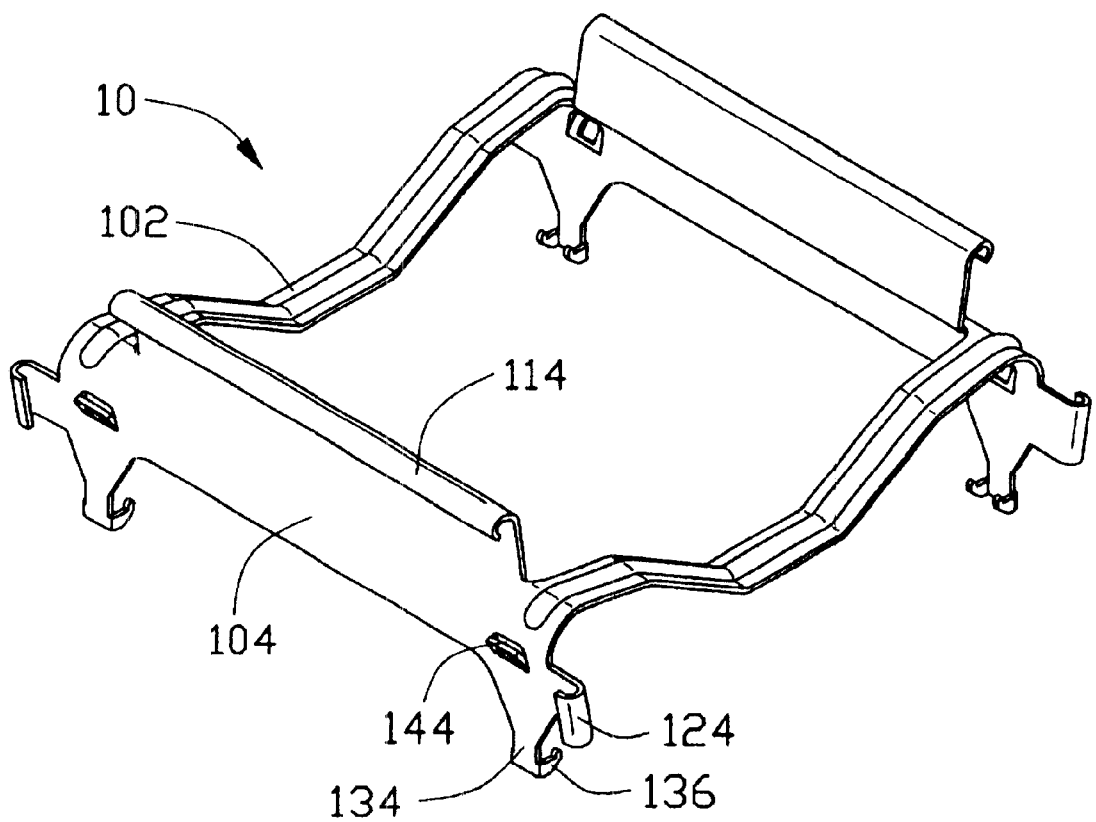
FIG. 2 is an enlarged isometric view of the clip of FIG. 1.

Referring also to FIG. 2, the heat sink clip 10 comprises two opposite side plates 104, and two opposite pressing portions 102 connecting between the side plates 104. Each pressing portion 102 is generally arcuate, which enables it to resiliently press the heat sink 20. Each side plate 104 is sloped slightly inwardly from top to bottom. This enables the side plates 104 to resiliently clamp the mounting frame 30. A pair of first handles 114 is upwardly formed from top edges of the side plates 104 respectively. A pair of second handles 124 extends outwardly in respective opposite directions from opposite ends of each side plate 104. A pair of legs 134 depends from opposite ends respectively of a bottom edge of each side plate 104. A pair of spaced hooks 136 is inwardly formed from a free end of each leg 134, for insertion into a corresponding hole 304 of the mounting frame 30. A pair of openings 144 is defined in the opposite ends of each side plate 104, for insertion of a screwdriver (not shown) thereinto.

Figure 3:
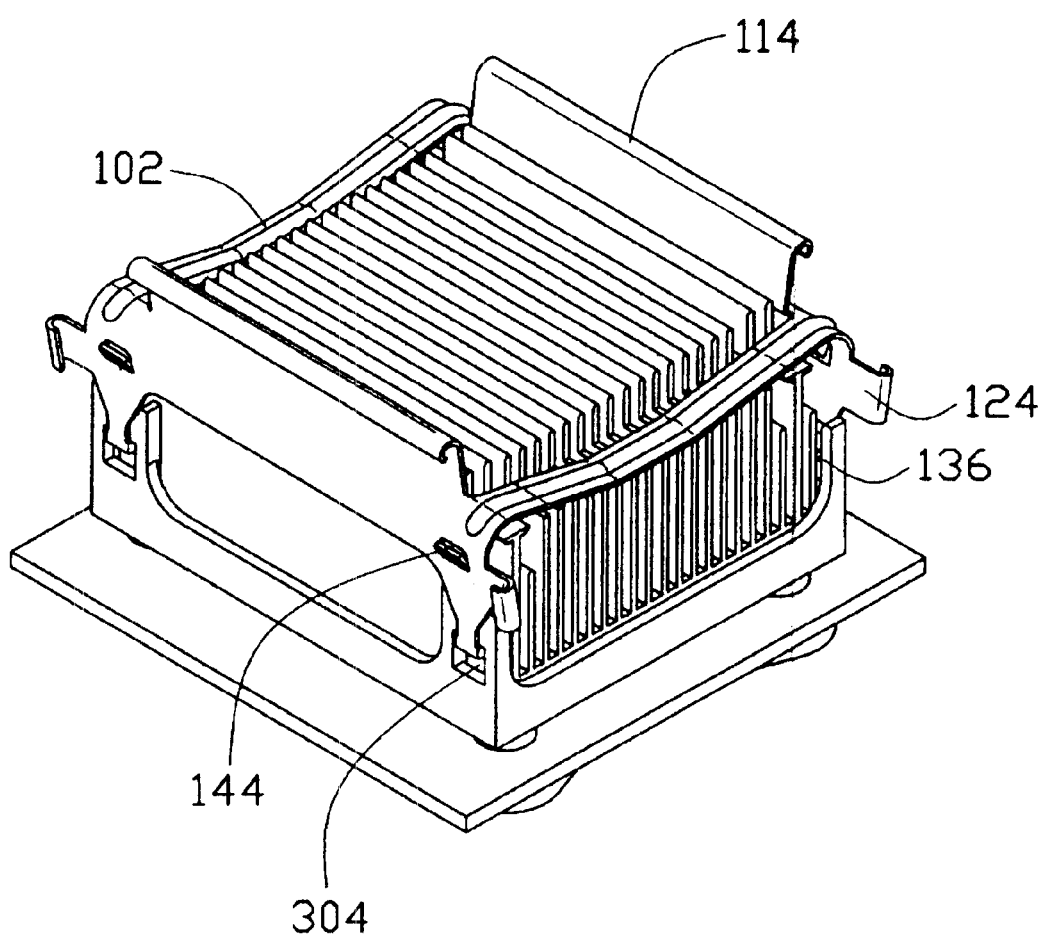
FIG. 3 is an assembled view of FIG. 1.

Referring also to FIG. 3, in assembly, the heat sink 20 is placed in the mounting frame 30. The recessed portions 206 of the heat sink 20 are in general alignment with the corresponding protrusions 302 of the mounting frame 30. The first handles 114 of the clip 10 are grasped, and the clip 10 is placed on the heat sink 20. The pressing portions 102 of the clip 10 rest on the recessed portions 206 of the heat sink 20. The legs 134 of the clip 10 are aligned with the holes 304 of the mounting frame 30. The first handles 114 are squeezed toward each other so that the hooks 136 resiliently engage in the holes 304. Simultaneously, the pressing portions 102 resiliently press the recessed portions 206 downward. Thus the chassis 202 of the heat sink 20 firmly presses against the electronic package, with the heat sink 20 being securely mounted in the mounting frame 30 by the clip 10.

In manual disassembly, the first handles 114 are squeezed toward each other, and simultaneously two of the second handles 124 at one side plate 104 are gripped. The first handle 114 of said one side plate 104 is pushed downward, and simultaneously the second handles 124 are pulled outward. This enables the hooks 136 of said one side plate 104 to escape from the corresponding holes 304. The clip 10 is then easily removed from the mounting frame 30 and the heat sink 20.

In disassembly using a screwdriver, the screwdriver is inserted into one of the openings 144 of one side plate 104 of the clip 10. The screwdriver is then rotated toward an opposite side of the clip 10 until the corresponding hooks 136 escape from the corresponding hole 304. This procedure is repeated for the other opening 144 of said one side plate 104. The clip 10 is then easily removed from the mounting frame 30 and the heat sink 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip adapted to cooperate with a mounting frame to attach a heat sink to an electronic device, the clip comprising:

two side plates, a first handle arranged at upper portions of each of the side plates, a pair of second handles arranged at opposite ends of each of the side plates, and at least one hook arranged at a bottom of each of the side plates for engaging with the mounting frame; and at least one pressing portion connecting between the two side plates for pressing the heat sink to the electronic device.

2. The clip recited in claim 1, wherein the clip has two pressing portions.

3. The clip recited in claim 2, wherein the pressing portions connect between upper ends of the side plates respectively, and each of the pressing portions is generally arcuate.

4. The clip recited in claim 1, wherein each of the side plates is sloped inwardly from top to bottom.

5. The clip recited in claim 4, wherein each of the first handles extends upwardly from an upper edge of the corresponding side plate.

6. The clip recited in claim 4, wherein at least one leg depends from at least one of the opposite ends of each of the side plates.

7. The clip recited in claim 6, wherein the at least one hook is formed at the at least one leg.

8. The clip recited in claim 1, wherein at least one opening is defined in at least one of the opposite ends of each of the side plates, for facilitating manipulation with a tool.

9. A heat sink assembly, comprising:

a motherboard with an electronic device mounted thereon;

a mounting frame attached on the motherboard, the mounting frame defining a plurality of holes;

a heat sink attached on the electronic device within the mounting frame, the heat sink comprising a chassis, a plurality of fins arranged on the chassis, and at least one recessed portion located at an upper region of the fins; and a heat sink clip comprising two side plates and at least one pressing portion, the at least one pressing portion connecting between the two side plates and pressing on the at least one recessed portion of the heat sink, a pair of first handles arranged at upper portions of the side plates, at least one hook arranged at a bottom of each of the side plates, and engaged in a corresponding hole, whereby the heat sink is resiliently and mounted on the mounting frame.

10. The heat sink assembly recited in claim 9, wherein the heat sink clip further comprises a pair of second handles arranged at opposite ends of each of the side plates.

11. The heat sink assembly recited in claim 9, wherein at least two protrusions extend upwardly from opposite sides of the mounting frame, and the plurality of holes is defined in respective ends of the protrusions.

12. A heat sink assembly comprising:

a heat sink defining lengthwise and lateral directions perpendicular to each other;

a unitary clip including:
      two parallel pressing portions extending along said lengthwise direction;
      a pair of legs extending downwardly from two opposite lengthwise ends of each of said pressing portions for latching to a device mounted on a printed circuit board;
      at least one side plate extending along the lateral direction and connected between two corresponding lengthwise ends of said two parallel pressing portions; wherein
         the side plate includes a common first handle for use with both said two parallel pressing portions while having two respective second handles for use with said two parallel pressing portions.

13. The assembly recited in claim 12, wherein another side plate having similar structures as the side plate, is formed at other corresponding lengthwise ends of the pressing portions opposite to said side plate.

14. The assembly as recited in claim 12, where said clip defines a rectangular frame.

15. The assembly as recited in claim 12, wherein said first handle and said second handle deflectably extend in different directions.

* * * * *